United States Patent
Kurosawa et al.

(10) Patent No.: US 6,204,911 B1
(45) Date of Patent: *Mar. 20, 2001

(54) EXPOSURE APPARATUS AND DEVICE MANUFACTURING METHOD

(75) Inventors: Hiroshi Kurosawa, Matsudo; Kunitaka Ozawa, Utsunomiya; Noriyasu Hasegawa, Utsunomiya; Keiji Yoshimura, Utsunomiya, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/705,089

(22) Filed: Aug. 29, 1996

(30) Foreign Application Priority Data

Aug. 30, 1995 (JP) .................................. 7-245427
Aug. 22, 1996 (JP) .................................. 8-239842

(51) Int. Cl.⁷ .......................... G03B 27/42; G03B 27/54; G03B 27/72
(52) U.S. Cl. ................ 355/53; 355/67; 355/69; 355/70; 355/71
(58) Field of Search .................. 355/35, 53, 67, 355/77, 68–71; 430/30; 356/399, 400, 401; 250/492.2, 492.22, 492.23

(56) References Cited

U.S. PATENT DOCUMENTS

| | | | |
|---|---|---|---|
| 3,823,318 | 7/1974 | Krause | 250/214 P |
| 4,519,692 | 5/1985 | Michalik | 354/412 |
| 4,676,630 | 6/1987 | Matsushita et al. | 355/53 |
| 4,711,568 | 12/1987 | Torigoe et al. | 355/68 |
| 4,748,477 | 5/1988 | Isohata et al. | 355/53 |
| 4,749,867 | 6/1988 | Matsushita et al. | 250/442.1 |
| 4,804,978 | 2/1989 | Tracy | 346/108 |
| 4,822,975 | 4/1989 | Torigoe | 219/121.85 |
| 4,884,101 | 11/1989 | Tanimoto | 355/68 |
| 4,947,047 | 8/1990 | Muraki | 250/492.2 |
| 4,970,546 | 11/1990 | Suzuki et al. | 355/53 |
| 4,974,919 | 12/1990 | Muraki et al. | 350/6.6 |
| 4,998,134 | 3/1991 | Isohata et al. | 355/53 |
| 5,053,614 | 10/1991 | Yui et al. | 250/205 |
| 5,107,275 | 4/1992 | Tsuruoka et al. | 346/1.1 |
| 5,112,133 | 5/1992 | Kurosawa et al. | 356/401 |
| 5,119,390 | 6/1992 | Ohmori | 372/25 |
| 5,171,965 | 12/1992 | Suzuki et al. | 219/121.6 |
| 5,182,615 | 1/1993 | Kurosawa et al. | 356/400 |
| 5,191,374 | 3/1993 | Hazama et al. | 355/43 |
| 5,250,797 | 10/1993 | Sano et al. | 250/205 |
| 5,475,491 | 12/1995 | Shiozawa | 356/394 |
| 5,491,534 | * 2/1996 | Shiozawa | 355/69 |
| 5,608,492 | * 3/1997 | Sato | 355/68 |
| 5,627,627 | * 5/1997 | Suzuki | 355/68 |
| 5,663,784 | * 9/1997 | Tanimoto | 355/68 |
| 5,728,495 | * 3/1998 | Ozawa | 430/30 |
| 5,846,678 | * 12/1998 | Nishigori et al. | 430/30 |

FOREIGN PATENT DOCUMENTS

| | | |
|---|---|---|
| 61-97830 | 5/1986 | (JP) . |
| 4-69660 | 3/1992 | (JP) . |
| 5-62876 | 3/1993 | (JP) . |
| 6-119971 | 4/1994 | (JP) . |

\* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

An exposure apparatus includes a light source for providing pulse light, a mask scanner for scanning a mask having a pattern, a wafer scanner for projecting a wafer onto which the pattern is to be projected and a light emission period determining device. The mask scanner and the wafer scanner scan the mask and the wafer in a timed relation so that the mask is illuminated while superposing portions of an illumination region defined by the pulse light and being narrower than the pattern such that the pattern is lithographically transferred onto the wafer. The light emission period determining device determines a period of emission of the pulse light, prior to an actual exposure process, wherein the emission period can be changed in accordance with a required precision of an integrated exposure amount.

40 Claims, 9 Drawing Sheets

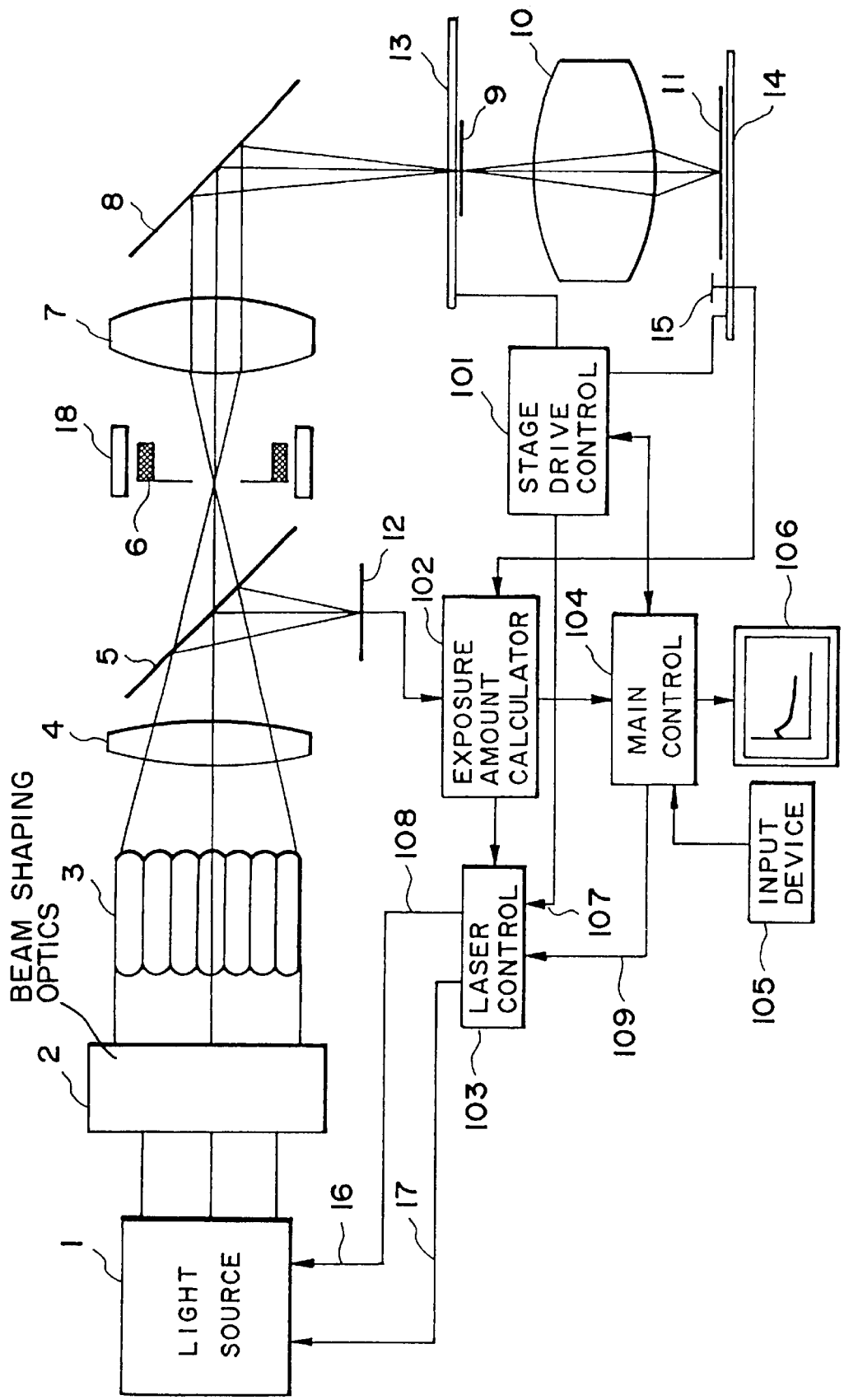
F I G. 1

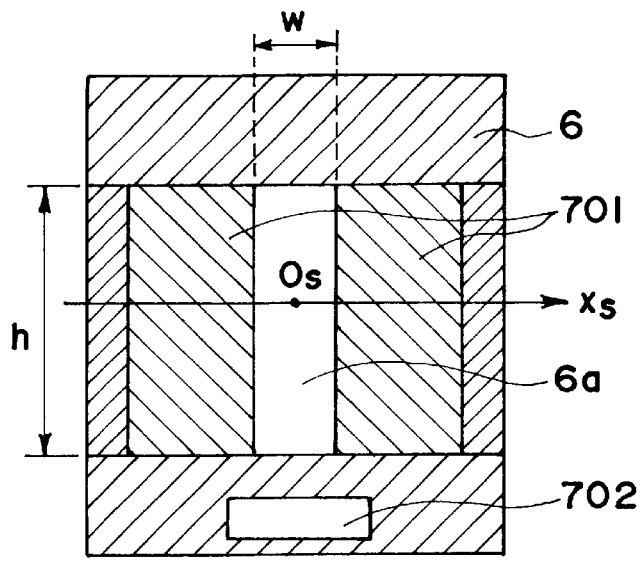
F I G. 2
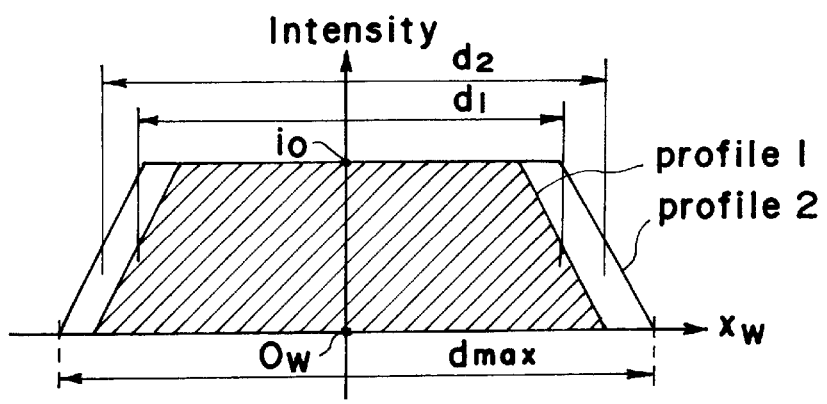
F I G. 3
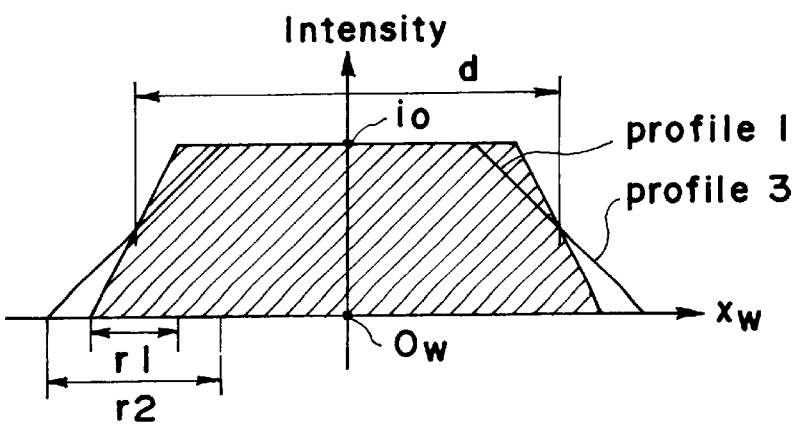
F I G. 4

EXPOSURE APPARATUS AND DEVICE MANUFACTURING METHOD

FIELD OF THE INVENTION AND RELATED ART

This invention relates to an exposure apparatus and, more particularly, to an exposure apparatus suitably usable in a lithographic process of device manufacturing processes for a semiconductor device such as an IC or LSI, a liquid crystal device, an image pickup device such as a CCD or a magnetic head, for example.

With the need of miniaturization of an IC pattern, strict precision is required to exposure non-uniformness in a lithographic process. For a dynamic RAM of 256 MB, as an example, a line width processing precision of 0.25 micron is required and, in this case, a tolerable exposure non-uniformness is estimated as about 1%.

Also, with respect to the wavelength of exposure light, for enhancement of resolution, those light sources which provide light of a shorter wavelength than i-line of conventional Hg lamps have been recently used. Excimer lasers are a typical example of them. However, excimer lasers are interrupted light emission type lasers, and they produce light of pulses. At an upper limit level, for light emission spacings of about 2.5 msec., the duration of light emission is about several tens of nsec. Further, there is a problem that the emitted light intensity of each pulse light disperses largely to a controlled variable applied externally.

In a case of a scan type exposure apparatus having a light source of an excimer laser, for example, since the number of light pulses necessary for exposure of one shot is about fifty (50), if the emitted light intensity varies by one pulse due to dispersion of the intensity of each pulse, then a quantized error results and, by plural light pulses, a deterministic error of an integrated exposure amount is produced.

In an exposure apparatus which uses a light source comprising a pulse light source such as an excimer laser wherein the emitted light intensity varies with emissions of light, as compared with an exposure apparatus having a conventional light source of a Hg lamp, for example, it is not easy to make uniform the integrated exposure amount upon a substrate to be exposed.

In scanning exposure apparatuses, the integrated exposure amount in an arbitrary unit scan exposure region involves a non-correctable residual error which is provided by an intensity error of a last pulse light emitted last in the process of scan exposure. This causes non-uniformness of exposure. If the emitted light intensity of each pulse is lowered and, on the other hand, the light emission frequency of the pulse light source is increased, the error by the last emitted pulse light becomes relatively small, relative to the integrated exposure amount. Thus, the exposure non-uniformness may be reduced.

However, there is an upper limit to the light emission rate of a pulse light source. Currently, about 400 Hz is the upper limit. As a result, if the method described above is to be used to make the integrated exposure amount uniform, the emitted light intensity of the pulse light source as well as the scan speed have to be lowered to enlarge the number of average light pulses received by a unit scan exposure region. This necessarily results in slower throughput.

On the other hand, in the manufacture of a semiconductor device, exposure processes of a number ten (10) to twenty (20) are repeatedly executed to one semiconductor substrate (wafer). These exposure processes have different linewidth precisions and alignment precisions to patterns to be printed by respective processes. In consideration of this, a method has been proposed in which different exposure apparatuses are used for a critical layer where a high precision is required and for a rough layer where a precision as high as that for the critical layer is not required. As for the exposure apparatus for the exposure process of rough layers, an apparatus which enables a high throughput, though precision is not required therefor, has been used.

SUMMARY OF THE INVENTION

It is an object of the present invention to provide an exposure apparatus which enables optimization of performance such as throughput or exposure precision, for example, as required to an exposure apparatus, in accordance with the fineness of a pattern, this being able to be done by changing a parameter related to scan exposure on the basis of a tolerance ratio of exposure non-uniformness.

In accordance with an aspect of the present invention, there is provided an exposure apparatus, comprising: a light source for providing pulse light; mask scanning means for scanning a mask having a pattern; wafer scanning means for scanning a wafer onto which the pattern is to be projected; wherein said mask scanning means and said wafer scanning means serve to scan the mask and the wafer in a timed relation so that the mask is illuminated while superposing portions of an illumination region defined by the pulse light and being narrower than the pattern such that the pattern is lithographically transferred onto the wafer; and at least one of (i) scan speed determining means for determining scan speed of the mask and the wafer, (ii) light emission period determining means for determining the period of emission of the pulse light, (iii) illumination range determining means for determining the range of illumination for the mask, and (iv) position determining means for determining the position of illumination range limiting means with respect to a direction of an optical axis, such that a parameter related to scan exposure such as the scan speed, the light emission period, the illumination range or the position of the illumination range limiting means with respect to the optical axis direction, can be made variable on the basis of a tolerance ratio of exposure non-uniformness.

The tolerance ratio of exposure non-uniformness may preferably be determined on the basis of a minimum linewidth of the pattern.

The tolerance ratio of exposure non-uniformness may preferably be larger with a wider minimum linewidth of the pattern.

In an exposure apparatus according to the present invention, if there is a margin to the tolerance ratio of exposure non-uniformness, the light emission period of the light source may be prolonged while maintaining the exposure non-uniformness at about a tolerable level, by which the lifetime of the light source can be prolonged.

With an exposure apparatus according to the present invention, accurate manufacture of a device such as a semiconductor device, a liquid crystal device, an image pickup device or a magnetic head, for example, is enabled.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of an exposure apparatus according to a first embodiment of the present invention.

FIG. 2 is a schematic view of a main portion of a movable slit 6 as viewed in the direction of an optical axis of an illumination optical system.

FIG. 3 is a schematic view for explaining changes in intensity profile as a width w of an exposure sli 6a is changed.

FIG. 4 is a schematic view for explaining changes in width of a half shadow region as a movable slit 6 moves in the direction of an optical axis.

DESCRIPTION OF THE PREFERRED EMBODIMENTS

Figure 5:
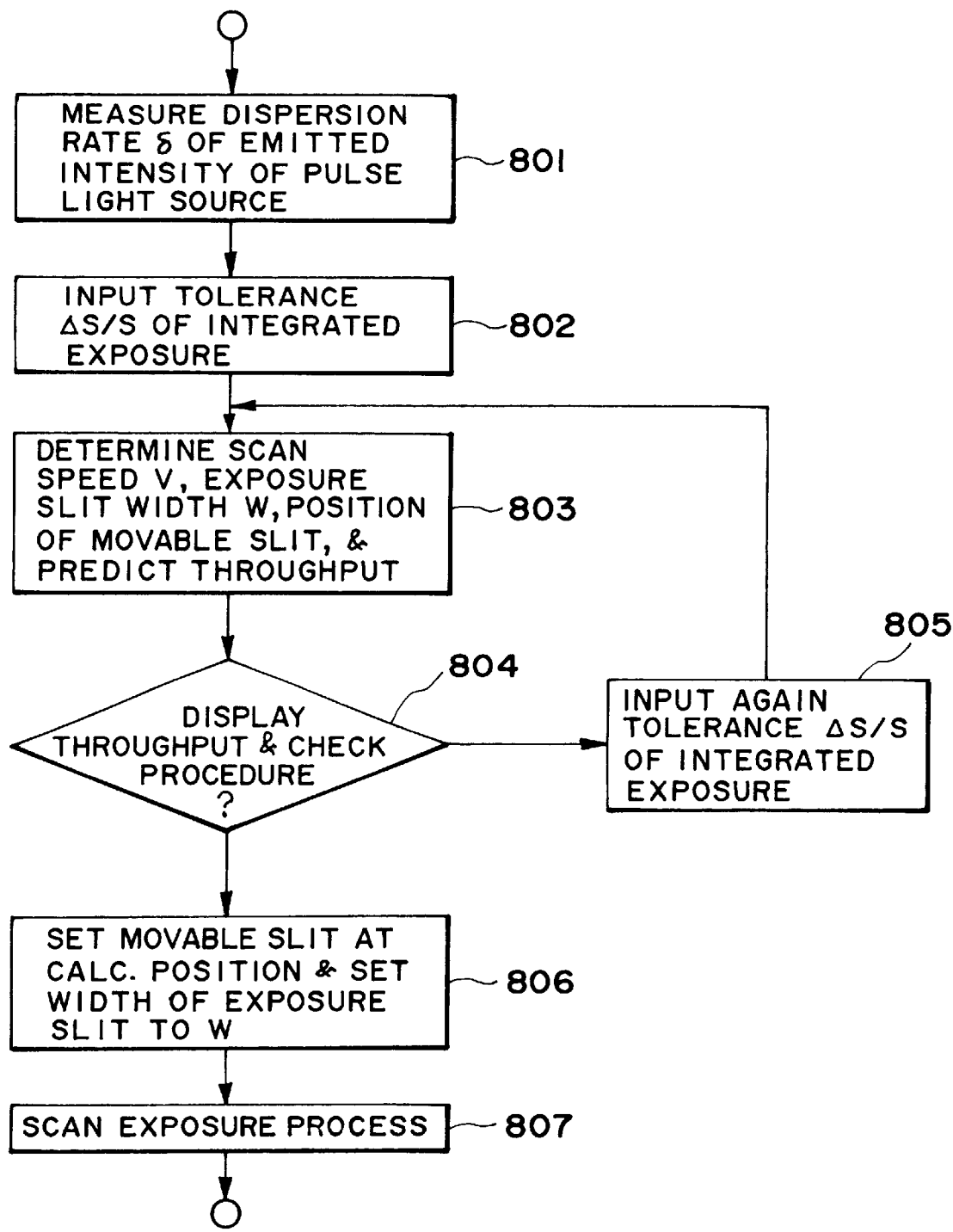
FIG. 5 is a flow chart for explaining operations made in the first embodiment.

FIG. 1 is a schematic view showing the structure of an exposure apparatus according to a first embodiment of the present invention. In this embodiment, the invention is applied to an exposure apparatus for the manufacture of devices such as semiconductor devices (ICs or LSIs), image pickup devices such as CCDs or magnetic heads, for example. The exposure apparatus is arranged so that light from a light source is projected to a reticle through an illumination optical system and a circuit pattern formed on the reticle is projected and printed by a projection lens, in a reduced scale, on a substrate which is coated with a photosensitive material.

Denoted in the drawing at 1 is a light source which comprises a pulse laser such as an excimer laser, for example, and it emits pulse light. Denoted at 2 is a beam shaping optical system for transforming light from the light source 1 into a desired shape, the resultant light being projected on a light entrance surface of an optical integrator 3. The optical integrator 3 comprises a fly's eye lens having a number of small lenses. Plural secondary light sources are defined in the vicinity of the light exit surface of the integrator. Denoted at 4 is a condenser lens which serves to Kohler illuminate a movable slit 6 with light from the secondary light sources adjacent to the light exit surface of the optical integrator 3.

The light illuminating the movable slit 6 then illuminates a reticle 9 by way of an imaging lens 7 and a mirror 8. The movable slit 6 is disposed at a position slightly shifted from a position which is optically conjugate with the reticle 9, and the movable slit 6 is made movable along a direction of an optical axis. The shape of an opening of the movable slit 6 is effective to determine the shape and size of an illumination region on the reticle 9. Denoted at 18 is a voice coil motor for movement control of the movable slit 6 in the optical axis direction. Denoted at 12 is an exposure amount detector (detector A) for detecting the light quantity of a portion of pulse illumination light, being divided by a half mirror 5. It applies an output signal to an exposure amount calculator 102.

The beam shaping optical system 2, the optical integrator 3, the condenser lens 4, the movable slit 6, the imaging lens 7 and the mirror 8 are components of an illumination optical system. The illumination optical system further includes a light attenuating means (not shown), such that the light quantity from the light source 1 can be adjusted at plural stages.

The reticle 9 has a circuit pattern formed thereon, and it is held on a reticle stage 13. Denoted at 10 is a projection lens for projecting the circuit pattern of the reticle 9 upon a semiconductor substrate 11 in a reduced scale. The semiconductor substrate 11 is called a wafer, and a resist material (photosensitive material) is applied to the surface thereof. The wafer is placed on a wafer stage which is movable three-dimensionally. Here, the relation between an exposure slit 6a as defined by the movable slit 6 and an image of the exposure slit 6a as formed on the semiconductor substrate 11, that is, the magnification, is denoted by $\beta_{S-W}$.

Mounted on the wafer stage 14 is an exposure amount detector (detector B) 15 by which the exposure amount with exposure light can be monitored through the projection lens 10.

Denoted at 101 is a stage drive control system, and it serves to control the reticle stage 13 and the wafer stage 14 so that they are moved in opposite directions at speeds of a ratio the same as the projection magnification of the projection lens 10 (1:4 in this embodiment), exactly at constant speeds. The exposure amount calculator 102 serves to transform an electrical signal, being photoelectrically converted by the exposure amount detector (detector A) 12 or exposure amount detector (detector B) 15, into a logic value, and to apply the result to a main control system 104. It is to be noted that, since the exposure amount detector (detector A) 12 can perform the intensity measurement even during the exposure process, it is used for estimation of an integrated value of exposure light to be projected. The exposure amount detector (detector B) 15 detects, at an initial stage of the exposure process, the intensity of light passing the projection lens 10 and impinging on the substrate 11. Then, the correlation between the thus detected light intensity and the light intensity as detected by the exposure amount detector (detector A) 12 is determined. In an actual exposure process, the value as detected by the exposure amount detector (detector A) 12 is corrected by using the thus determined correlation, to determine the exposure amount upon the substrate 11. Thus, the exposure amount detector (detector B) 15 does not perform measurement of exposure light intensity during the exposure process of the substrate 11.

Denoted at 103 is a laser control system which produces a trigger signal 16 and a charging voltage signal 17 in accordance with a desired exposure amount, and it controls the output energy and the light emission spacing of the light source 1. When the laser control system 103 produces the trigger signal 16 or charging voltage signal 17, an illuminance monitor signal 108 from the exposure amount calculator 102, a current position signal 107 from the stage drive control system 101 and hysteresis information from the main control system 104, for example, are used as parameters.

A desired exposure amount and tolerance for exposure non-uniformness are inputted into the main control system 104, from an input device 105 which is a man-machine interface or a media interface. The result obtained through the exposure amount detector (detector A) 12 or exposure amount detector (detector B) 15, or the result of estimation of an integrated exposure amount are displayed in a display 106.

From the data applied by the input device 105, from parameters peculiar to the exposure apparatus and/or from the data measured by the measuring means such as the exposure amount detectors (detectors A and B) 12 and 15, for example, the main control system 104 calculates a parameter group necessary for execution of scan exposure and transmits it to the laser control system 103 or the stage control system 101.

FIG. 2 is a schematic view of a main portion of the movable slit 6 as viewed in the direction of the optical axis of the illumination optical system. Denoted in the drawing at 701 are two movable aperture blades which can be moved in opposite directions, along a direction Xs (scan direction), by means of an aperture driving device 702, and an exposure slit 6a is defined between these blades. The size of the exposure slit 6a is determined by the width w between the two movable aperture blades 701 and by the length h (fixed) in a direction perpendicular to the direction Xs. When the width w of the exposure slit 6a changes, the intensity profile upon the substrate 11 of exposure light passing this slit changes such as shown in FIG. 3.

FIG. 3 is a schematic view for explaining changes in intensity profile as the width w of the exposure slit 6a of this embodiment changes. The drawing illustrates changes in intensity profile upon the substrate 11 as the width w of the two aperture blades 701 changes from w1 to w2. The axis of the abscissa in the drawing corresponds to an $x_w$ coordinate which is the scan direction of the substrate 11. The axis of the ordinate corresponds to the intensity of exposure light upon the substrate 11. As the width w changes from w1 to w2, upon the substrate 11, the distance between mid-points on opposite slant sides (half shadow or penumbra portions) of a trapezoidal intensity profile changes from $d1=w1\cdot\beta_{S-W}$ (profile 1) to $d2=w2\cdot\beta_{S-W}$ (profile 2). Namely, only the portions corresponding to the top and bottom of the trapezoid expand or contract, and the inclination of the slant sides (half shadow portions) does not change. Thus, if the width w is enlarged, the exposure area by one pulse increases, which is effective to enlarge the throughput. Since, however, the length of a diagonal of the range ($w\cdot\beta_{S-W} \times h\cdot\beta_{S-W}$) of the image of the exposure slit upon the substrate 11 is unable to extend beyond the diameter $\phi_0$ of the effective picture field of the projection lens 10 upon the substrate 11, there is an upper limit $w_{max}=d_{max}/\beta_{S-W}$ to the width w of the exposure slit 6a.

FIG. 4 is a schematic view for explaining changes in width of a half shadow region in a case wherein the movable slit of this embodiment moves in the optical axis direction. The drawing illustrates a change in intensity profile as the movable slit 6 is moved by the voice coil motor 18 along the optical axis of the illumination optical system. When the movable slit 6 moves while the width w of the exposure slit 6a is held unchanged, the intensity profile upon the substrate 11 changes from profile 1 to profile 3 illustrated. On this occasion, the inclination of the slant sides of the trapezoid changes, and the width r of the half shadow upon the plane of projection changes from r1 to r2. Thus, if the width r of the half shadow portion is to be changed, the movable slit 6 may be moved.

FIG. 5 is a flow chart of this embodiment. This flow chart covers the procedure from determination of the slit width w, the position of the movable slit 6 in the optical axis direction and the scan speed v of the wafer stage 14 on the basis of given environment variables, to execution of the scan exposure process. The following reference characters are used in the flow chart:

$\beta_{S-W}$: magnification of projection of exposure slit 6a onto substrate 11 w: width of exposure slit 6a (width in scan direction)

h: length of exposure slit 6a in a direction perpendicular to the scan direction d: width of image of exposure slit 6a upon substrate 11, and $d=w\cdot\beta_{S-W}$ e: length of image of exposure slit 6a upon substrate 11 in a direction perpendicular to the scan direction, and $e=h\cdot\beta_{S-W}$ v: scan speed of wafer stage 14

$\delta$: dispersion coefficient of emitted light intensity $\delta_m$: maximum level of dispersion coefficient of emitted light intensity r: width of half shadow region on substrate 11

$r_c$: intensity correction point $i_c$: light intensity at intensity correction point $i_0$: reference emission light intensity of light source 1 upon substrate 11

N: number of light emissions necessary for achieving target value of integrated exposure amount S: target value of integrated exposure amount $\Delta S$: tolerance value for non-uniformness of integrated exposure amount $\Delta S/S$: tolerance ratio for non-uniformness of integrated exposure amount T: light emission period (light emission spacing)

$\phi_0$: diameter of effective picture field of projection lens (on wafer side)

Now, a description will be made with reference to the flow chart.

Step 801

Dispersion rate $\delta$ of emitted light intensity as the light source is pulse oscillated is measured. To this end, the light source 1 is caused to emit light for measurement. Charging voltage signals of a constant level and trigger signals of constant intervals are applied to the light source 1, and emitted light intensities are measured through the exposure amount detector (detector A or B) 12 or 15. As for the dispersion coefficient $\delta$, a statistically representative value among thus measured values, e.g., $2\sigma$, is used.

Step 802

Integrated exposure amount S and tolerance ratio $\Delta S/S$ of the non-uniformness of integrated exposure amount are inputted through the input device 105. Generally, the tolerance ratio $\Delta S/S$ of non-uniformness of the integrated exposure amount should be smaller with a smaller linewidth of a circuit pattern on a reticle 9. Thus, the value $\Delta S/S$ is determined while taking into account the linewidth of a circuit.

Step 803

By using these values, the main control system 104 determines the scan speed v of the wafer stage 14, the width w of the exposure slit 6a, and the position of the movable slit 6. The manner of determination will be described later. Then, the throughput is predicted.

Step 804

The display 106 displays the thus determined scan speed v, width w of exposure slit 6a and position of movable slit 6 as well as calculated throughput. The operator determines whether the operation should be executed under these conditions or not. If the conditions being displayed are satisfactory, the procedure goes to step 806. If any of the conditions displayed should be changed, the procedure goes to step 805.

Step 805

Tolerance ratio ΔS/S of non-uniformness of the integrated exposure amount is set again. As regards the throughput, if the tolerance value ΔS of non-uniformness of the integrated exposure amount is too much regarded, the reference emission light intensity $i_0$ of the light source 1 has to be lowered optically by using a filter or the like to increase the number N of light emissions. This makes the throughput lower. If, therefore, a higher throughput is desired even though a slight exposure non-uniformness has to be accepted, a larger tolerance ratio ΔS/S of non-uniformness of the integrated exposure amount may be inputted again through the input device 105.

Step 806

The movable slit 6 is set and placed at the calculated position, and the width of the exposure slit 6a is set at the calculated value. Namely, the main control system 104 operates to set the exposure slit 6a at the size as determined, and also to cause the voice coil motor 18 to move and set the movable slit 6 at a determined position along the optical axis.

Step 807

The scan exposure process starts.

Figure 6:
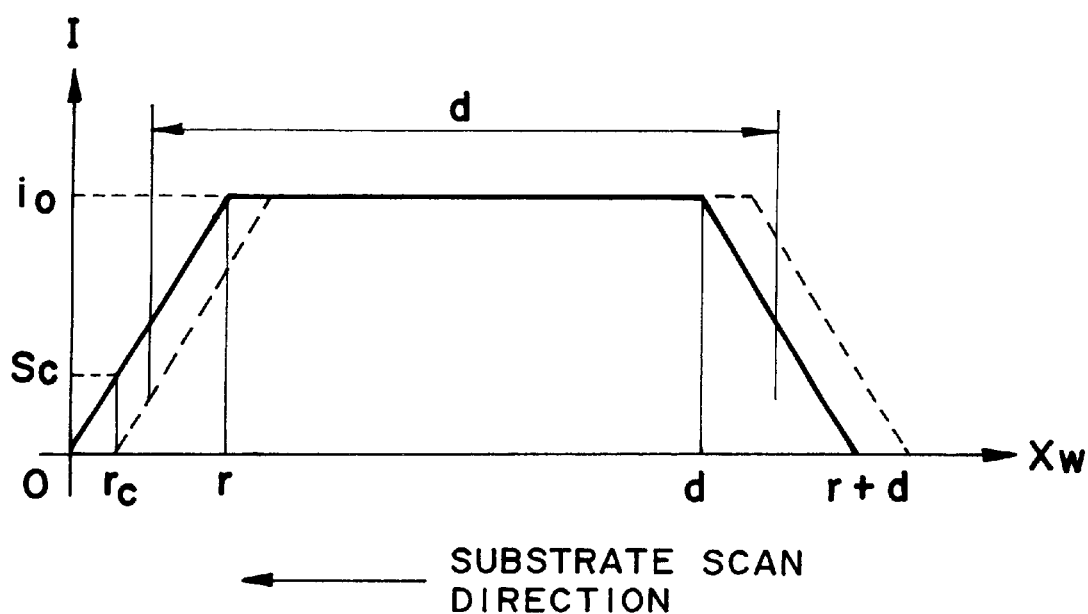
FIG. 6 is a graph for explaining a model of an intensity profile of exposure light upon a substrate 11.

Of the steps of the flow chart described above, the procedure at step 803 will be described in more detail. FIG. 6 is a graph showing a model of an intensity profile of exposure light upon the wafer 11. The axis of the abscissa corresponds to the distance along the scan direction ($x_W$ direction), and the axis of the ordinate corresponds to intensity I of the exposure light. The origin is at an end of the bottom of a regular trapezoid (with slants of the same length), the end facing the wafer movement direction. The intensity has a peak value $i_0$. The configuration depicted by a broken line in the drawing corresponds to a profile of exposure light to be provided by a subsequent light emission.

The left and right half shadow portions at the slant sides of the regular trapezoid have the same span, and the length is denoted by r. The distance d in the $x_W$ direction connecting the mid-points of the slant sides of the trapezoid corresponds to the width w of the exposure slit 6a, and there is a relation:

$$d = w \cdot \beta_{S-W} \quad (1)$$

The distance from the origin to the intensity correction point $r_c$ corresponds to the movement distance of the wafer through which the wafer 11 moves in a period before a subsequent emission of exposure light, and $r_c = vT$. It is at the point most unexposed-region side of the exposure region to be exposed last during this light emission, of the profile depicted by a solid line. The intensity of exposure light at this point is denoted by $i_c$.

The intensity correction calculation at each pulse light emission is set so that at the intensity correction point $r_c$ the intensity $i_c$ accomplishes a desired target value S to the integrated exposure amount. The intensity $I(x_W)$ at an arbitrary coordinate, in this model, can be expressed by the following equation:

$$I(x_W) = \begin{cases} 0; & x_W \le 0, x_W \ge r+d \\ (i_0/r) \cdot x_W; & 0 < x_W < r \\ i_0; & r \le x_W \le d \\ -(i_0/r) \cdot \{x_W - (d+r)\}; & d < x_W < d+r \end{cases} \quad (2)$$

Figure 7:
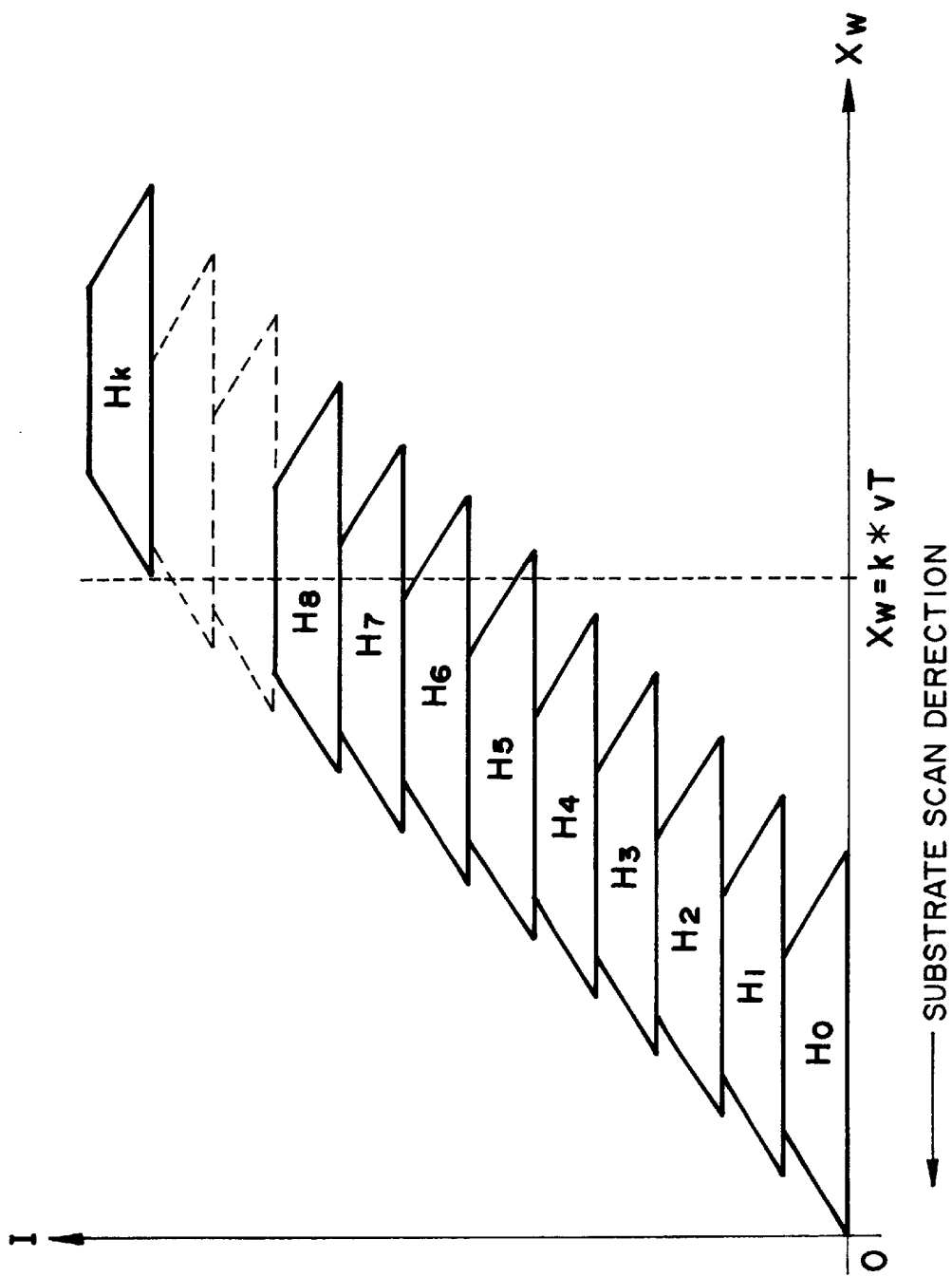
FIG. 7 is a graph for explaining estimation of an integrated exposure amount upon a substrate 11 in a case where the substrate is exposed with exposure light having an intensity profile such as shown in FIG. 6.

FIG. 7 is a schematic view for explaining an estimation of an integrated exposure amount of a wafer which is to be exposed by exposure light having an intensity profile as shown in FIG. 6. The drawing illustrates a case where, while moving the wafer stage 14 at a constant speed v, the substrate 11 is exposed by pulse light being emitted at regular emission intervals T.

The integrated exposure amount at an arbitrary position on the $x_W$ axis along the substrate scan direction (the $x_W$ coordinate axis is fixed to the substrate), can be considered as being the total of the intensities of trapezoids through which a broken line in the drawing extends. Reference characters $H_0, H_1, H_2 \ldots$, and $H_k$ denote the light emission numbers. Using this drawing, the process of determining the scan speed v, the width w of the exposure slit 6a, and the position of the movable slit 6 from a designated tolerance ratio ΔS/S of non-uniformness of integrated exposure amount, will be explained.

The number N of light emissions necessary for achieving a target value S at an arbitrary exposure position can be determined from the reference emission light intensity $i_0$ of the light source 1 and the target value S of the integrated exposure amount, in accordance with the following equation:

$$N = S/i_0 \quad (3)$$

Between the width d of the image of the exposure slit 6a upon the substrate 11 and the scan speed v, there is a relation such as follows:

$$N \cdot T = d/v \quad (4)$$

In this embodiment, when the emission light intensity of a pulse to be emitted last is so controlled that the integrated exposure amount at an exposure position reaches a target value S, the intensity dispersion coefficient $\delta_m$ of the last emitted pulse produces non-uniformness ΔS of the integrated exposure amount.

Figure 8:
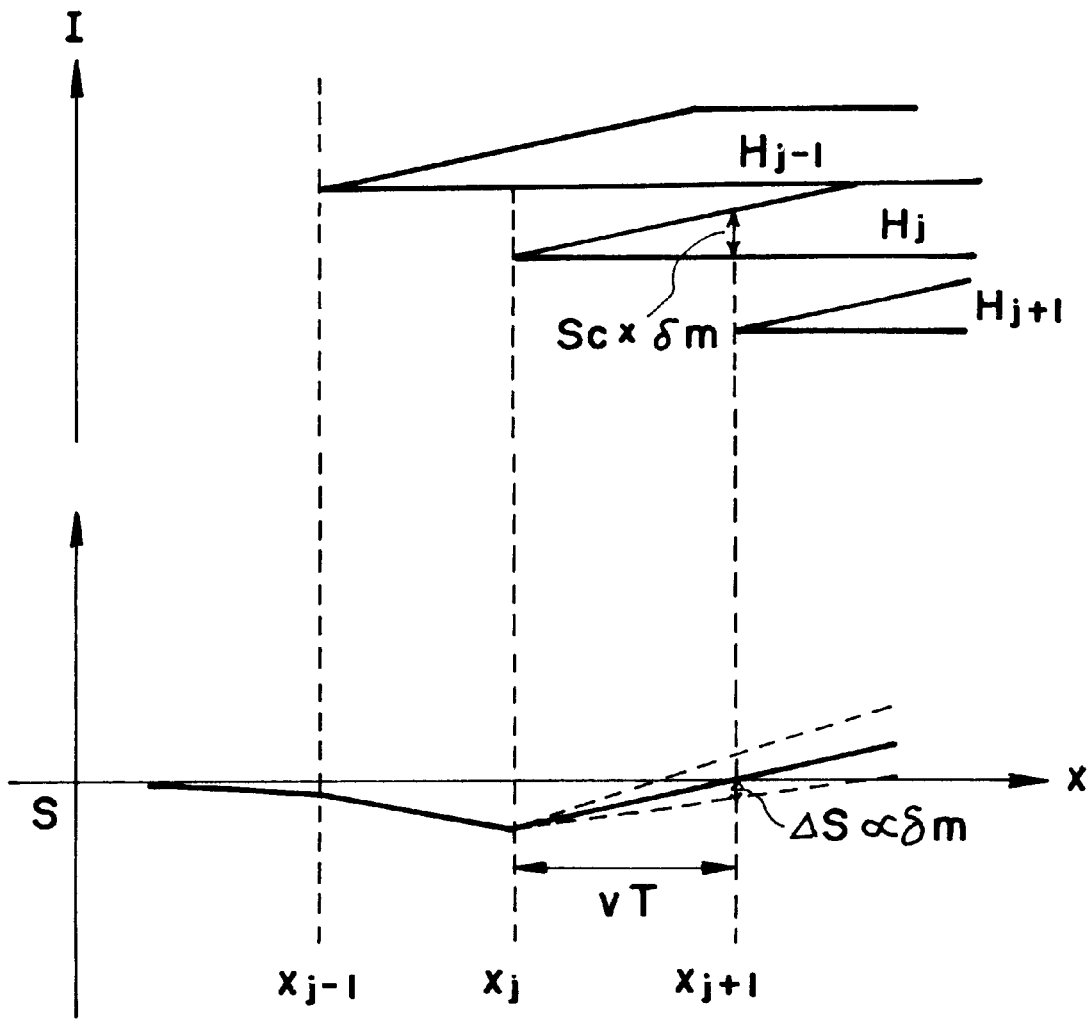
FIG. 8 is a schematic view for explaining the mechanism of production of non-uniformness $\Delta S$ of an integrated exposure amount.

Referring now to FIG. 8, the mechanism of production of non-uniformness ΔS of the integrated exposure amount will be explained. The upper portion of FIG. 8 illustrates, like FIG. 7, the intensity of exposure light taken on the axis of the abscissa and the $x_W$ coordinate system (substrate scan direction) taken on the axis of the ordinate. It is to be noted that in FIG. 8, for convenience of illustration, the higher the position of the intensity profile is, the earlier it is produced by light emission. The lower portion of FIG. 8 illustrates an integrated exposure amount taken on the axis of the abscissa and the $x_W$ coordinate system taken on the axis of the ordinate. Namely, the lower portion of FIG. 8 depicts an integrated exposure amount distribution.

At a point on the substrate 11 as denoted by $x_{j+1}$, when the exposure slit 6a passes, there is produced non-uniformness ΔS of the integrated exposure amount such as illustrated in FIG. 8, this being attributable to an intensity dispersion coefficient $\delta_m$ of the last emitted light pulse ($H_j$) at that point.

The non-uniformness $\Delta S$ of the integrated exposure amount is produced in proportion to dispersion of intensity $i_c$ at the intensity correction point $x_{j+1}$ for $H_j$, and it can be expressed as $\Delta S=\delta_m \cdot i_c$. Therefore, the tolerance ratio $\Delta S/S$ of non-uniformness of the integrated exposure amount can be expressed by the following relation:

$$\Delta S/S=(\delta_m \cdot i_c)/S \qquad (5)$$

From the inclination of the trapezoidal profile and from the distance $r_c$ through which the image of the exposure slit 6a displaces on the substrate 11 per one light emission, the value of $i_c$ can be expressed as follows:

$$i_c=(i_0/r)\cdot v\cdot T \qquad (6)$$

Also, since the range of irradiation of exposure light having the profile shown in FIG. 6 should be within the diameter $\phi_0$ of the effective picture field of the projection lens 10, the following limiting relation applies to d and r:

$$\phi_0^2 \geq (d+r)^2+e^2 \qquad (7)$$

where $$e=h\cdot\beta_{S\text{-}W} \qquad (8)$$

In this embodiment, since the whole diameter of the effective picture field of the projection lens 10 is used, both sides of equation (7) are equal to each other. Also, h is fixed. Thus, if $$d+r=W_0 \qquad (9)$$

is set, then, from equation (7), it follows that:

$$W_0=(\phi_0^2-e^2)^{1/2} \qquad (10)$$

Thus, Wo becomes a constant.

Synthesizing equations (2)–(10), the relation between the tolerance ratio $\Delta S/S$ of non-uniformness of integrated exposure amount and the parameters can be expressed as follows:

$$\Delta S/S=[\delta_m \cdot (v\cdot T)^2]/[(W_0-r)\cdot r] \qquad (11)$$

In equation (11), $\delta_m$ is a maximum value of emission intensity dispersion coefficient $\delta$ as determined by measurement, and it is a fixed value peculiar to the instrument. Also, while the light emission spacing T of the light source can be changed, here it is set at a minimum value for enhancement of throughput. Thus, once a tolerance ratio $\Delta S/S$ of non-uniformness of the integrated exposure amount is designated, the relation between the wafer scan speed v and the width r of the half shadow region (i.e., remaining parameters) can be determined. By using the thus determined width r and from equations (1) and (9), the width w of the exposure slit 6a can be determined in accordance with the following equation:

$$w=(W_0-r)/\beta_{S\text{-}W} \qquad (12)$$

The value of width r of the half shadow region can be achieved by moving the position of the movable slit 6 (exposure slit 6a) along the optical axis of the illumination optical system.

At step 803, by using equations (11) and (12), one of the following procedures is performed to determine the scan speed v, the width w of the exposure slit 6a and the width r of the half shadow region:

1) Holding the width r of the half shadow region at an arbitrary value, the scan speed v is determined from the width w of the exposure slit 6a and the inputted tolerance ratio $\Delta S/S$ of non-uniformness of integrated exposure amount; and 2) Holding the scan speed v at an arbitrary value, the width r of the half shadow region is determined from the inputted tolerance ratio $\Delta S/S$ of non-uniformness of the integrated exposure amount and, then, the width w of the exposure slit 6a is determined. This procedure is performed by the main control system 104. Thus, the main control system 104 serves as a component of scan speed determining means. Also, the main control system 104 and the voice coil motor 18 are components of exposure slit determining means.

According to the investigation made by the inventors of the subject application, it has been confirmed that a practical scan speed of the wafer stage 14 during a scan exposure process is about 100 mm/sec. If the scan speed over 100 mm/sec. is achieved, then a synchronous following difference between the reticle stage 13 and the wafer stage 14 does not satisfy a predetermined alignment precision of the reticle 9 and the substrate 11. Further, in this embodiment, since the reticle stage 13 is high-speed scanned at a ratio four times the speed of the wafer stage 14, there arise technical problems such as deformation of the reticle during acceleration and deceleration of the reticle stage 13 and how to keep attraction of the reticle to the reticle stage, for example.

On the other hand, the lifetime of a gas of a KrF excimer laser used in an exposure apparatus is currently about ten (10) to fifteen (15) million emissions. If the scan speed cannot be increased for the reason described above, for maintaining an integrated exposure amount per unit area at a target value S, there will be a method in which the reference emission light intensity $i_0$ is controlled to a desired value through light attenuating means such as an ND filter (not shown) accommodated in the beam shaping optical system 2 or by controlling the charging voltage signal 17 and a method in which the number of light pulses received is controlled to a desired number by controlling the light emission frequency (light emission period T) of the light source. This can be predicted by the following equation which is derived from equations (3) and (4), that is:

$$S=(i_0\cdot d)/(v\cdot T) \qquad (13)$$

Namely, there is an alternative method that, for extending the lifetime of the light source 1 which comprises an excimer laser, for example, the light emission period T of the light source 1 may be made larger to thereby reduce the number of light emissions of the light source 1 necessary for the exposure of one shot. As a matter of course, when such a method is executed, the tolerance value of non-uniformness of the integrated exposure amount in equation (1) should be satisfied. That is, if the non-uniformness of integrated exposure amount can be sufficiently kept within the tolerance $\Delta S$, the exposure apparatus of the present invention may be so arranged that the magnitude of non-uniformness of integrated exposure amount is enlarged to a level near the tolerance $\Delta S$ and the light emission frequency of the light source is lowered to reduce the number of light emissions per one shot, thereby to prolong the gas lifetime of the light source 1.

It is seen from equations (11) and (12) that generally the product of scan speed v and light emission period T can be set large when the integrated exposure amount tolerance ratio $\Delta S/S$ is large. Thus, it is a possible form that the parameter setting may be chosen appropriately in accordance with situations, out of one in which the throughput is particularly regarded, one in which the lifetime of the light source is particularly regarded, and one in which both of them are regarded. Particularly, in a case wherein there is a limitation to the scan speed v as described hereinbefore, the light emission period T may preferably be set largest within a range in which the integrated exposure amount tolerance ratio ΔS/S is satisfied. If, on the other hand the integrated exposure amount tolerance ratio ΔS/S is small, parameter setting will be the one in which exposure precision is particularly regarded, such that the product of scan speed v and light emission period T is made small or, alternatively, the product of the width w of the exposure slit 6a and the width r of the half shadow region is made large.

In a scan exposure apparatus according to this embodiment of the present invention, as described hereinbefore, a tolerance ratio for non-uniformness of the integrated exposure amount as required to exposure shots on a photosensitive substrate is given and, by using scan speed determining means and/or exposure slit determining means, the scan speed v of the wafer, the width w of the exposure slit, the light emission period T of the light source and so on are determined. The exposure process is performed by using the thus determined scan exposure parameters. Thus, an exposure process in which the performance of the light source is effectively used, is achieved.

Since, in the exposure apparatus of this embodiment, the exposure parameters can be determined while setting a tolerance value ΔS of non-uniformness of integrated exposure amount in accordance with the linewidth of a circuit pattern, it is possible to switch the exposure condition (by choosing one for regarding exposure precision or one for regarding throughput, for example) in accordance with the state of the layer.

While in the embodiment described above the tolerance ratio ΔS/S of non-uniformness of integrated exposure amount, corresponding to the linewidth of the pattern, is designated manually, the exposure parameter determination may be made automatically by, for example, recording information on a reticle 9 (using a bar code, for example) and by reading the recorded information.

It is a possible alternative (second embodiment) that a deviation of a preceding emission light intensity $I_n$ from a designated target value $i_0$ is added to a subsequent emission light intensity designation level (charging voltage designation value), and that the scan speed v and the width r of the half shadow region are determined from the tolerance ratio ΔS/S of non-uniformness of integrated exposure amount.

It is a further alternative (third embodiment) that the light emission period T of the light source is changed to control the integrated exposure amount, and the scan speed v and the width r of the half shadow region are determined from the tolerance ratio ΔS/S of non-uniformness of integrated exposure amount.

Figure 9:
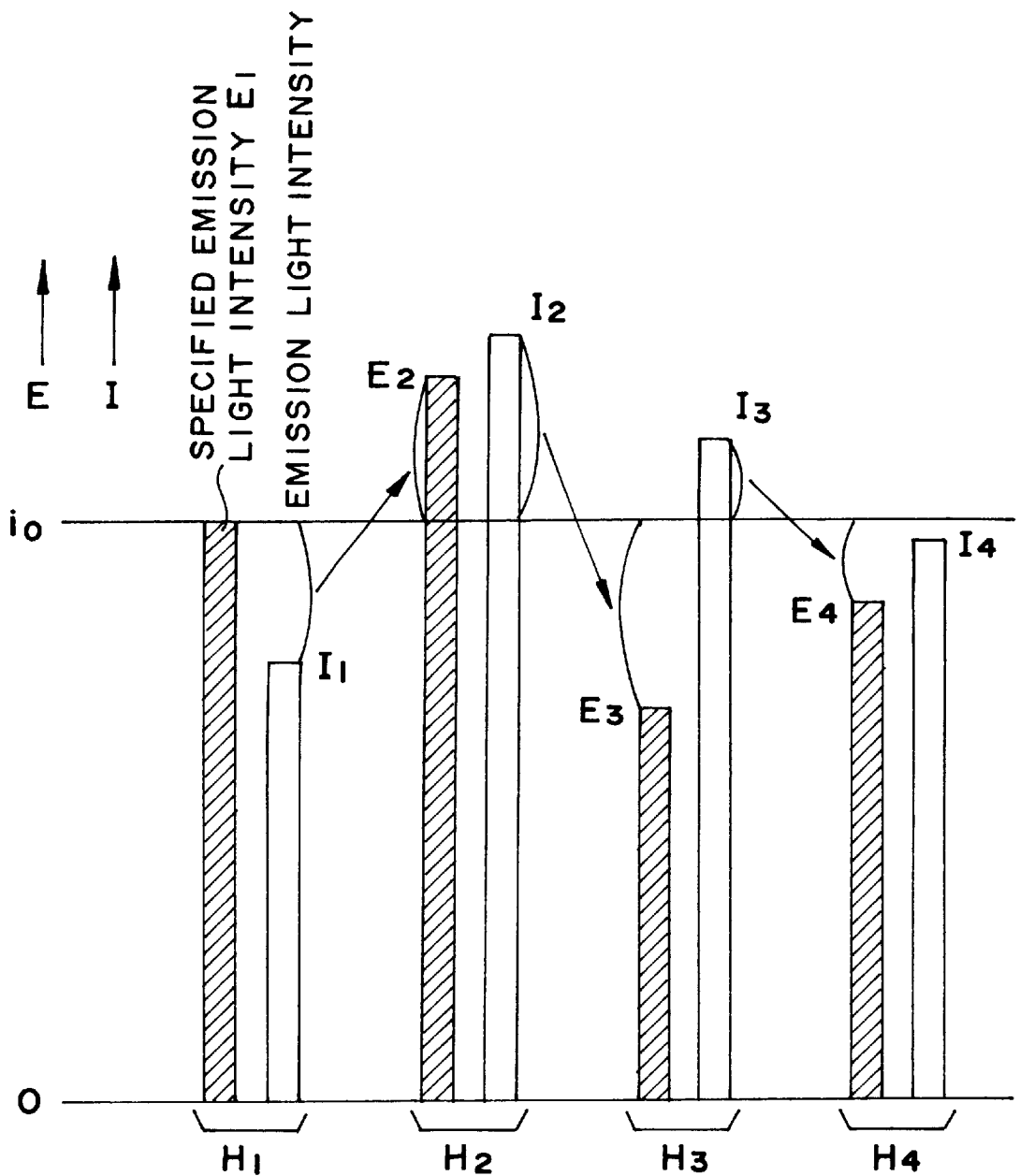
FIG. 9 is a schematic view for explaining the principle of control in a second embodiment of the present invention.

Now, a second embodiment of the present invention will be explained. FIG. 9 is a schematic view for explaining a concept of control in the second embodiment. In the drawing, for a second pulse light emission $H_2$, for example, if the intensity $I_1$ of a first pulse light emission $H_1$ does not reach a desired emission light intensity $i_0$, an intensity designation level $E_2$ wherein the deviation is added is applied with reference to the second pulse light emission $H_2$. Here, the emission light intensity level E is applied by means of the laser control system 103 in the form of a charge voltage signal 17. Namely, assuming now that:

$E_n$: emission light intensity designation level (charge voltage designation level) for an n-th pulse light emission $I_n$: peak value of emitted light intensity of n-th pulse, between them there is a relation such as follows:

$$I_n = A \cdot E_n \cdot b_n \tag{14}$$

where A is a proportion constant and $b_n$ is dispersion of an emitted light intensity of the n-th pulse light to an emission light intensity designation level.

The procedure of adding the deviation (shortage) of the emitted light intensity $I_n$ measured with reference to the just preceding pulse emission with respect to the target intensity $i_0$, can be expressed by the following equation:

$$E_{n+1} = i_0/A + [(i_0 - I_n)/A] \tag{15}$$

Also, from equation (13) it follows that:

$$I_{n+1} = A \cdot E_{n+1} + b_{n+1} \tag{16}$$

Thus, the following recurrence formula is obtainable:

$$I_{n+1} = i_0 + b_{n+1} + (i_0 - I_n) \tag{17}$$

If the initial value is $I_0 = i_0$, then a general term of $I_n$ is given by the following equation:

$$I_n = i_0 + \sum_{k}^{n} [\{(-1)**(n-k)\} \cdot b_k] \tag{18}$$

The integrated exposure amount up to n-th pulse light emission can be expressed by the following equation:

$$S(n \cdot v \cdot T) = \sum_{k=0}^{n} [(I_n/i_0) \cdot I\{(n-k) \cdot v \cdot T\}] \tag{19}$$

The value 2σ of S(n·v·T) detected as described above is then substituted into ΔS of equation (11), by which a similar procedure like that of the first embodiment can be done.

In determination of scan speed v, light emission period T and width w of exposure slit 6a, it is not possible to predetect the value of dispersion $b_n$ of the emitted light intensity. In place thereof, a data group having been produced on the basis of a preceding measurement made under the same condition may be used or, alternatively, random numbers having a similar dispersion may be used.

Next, an embodiment of a semiconductor device manufacturing method which uses an exposure apparatus such as shown in FIG. 1, will be explained.

Figure 10:
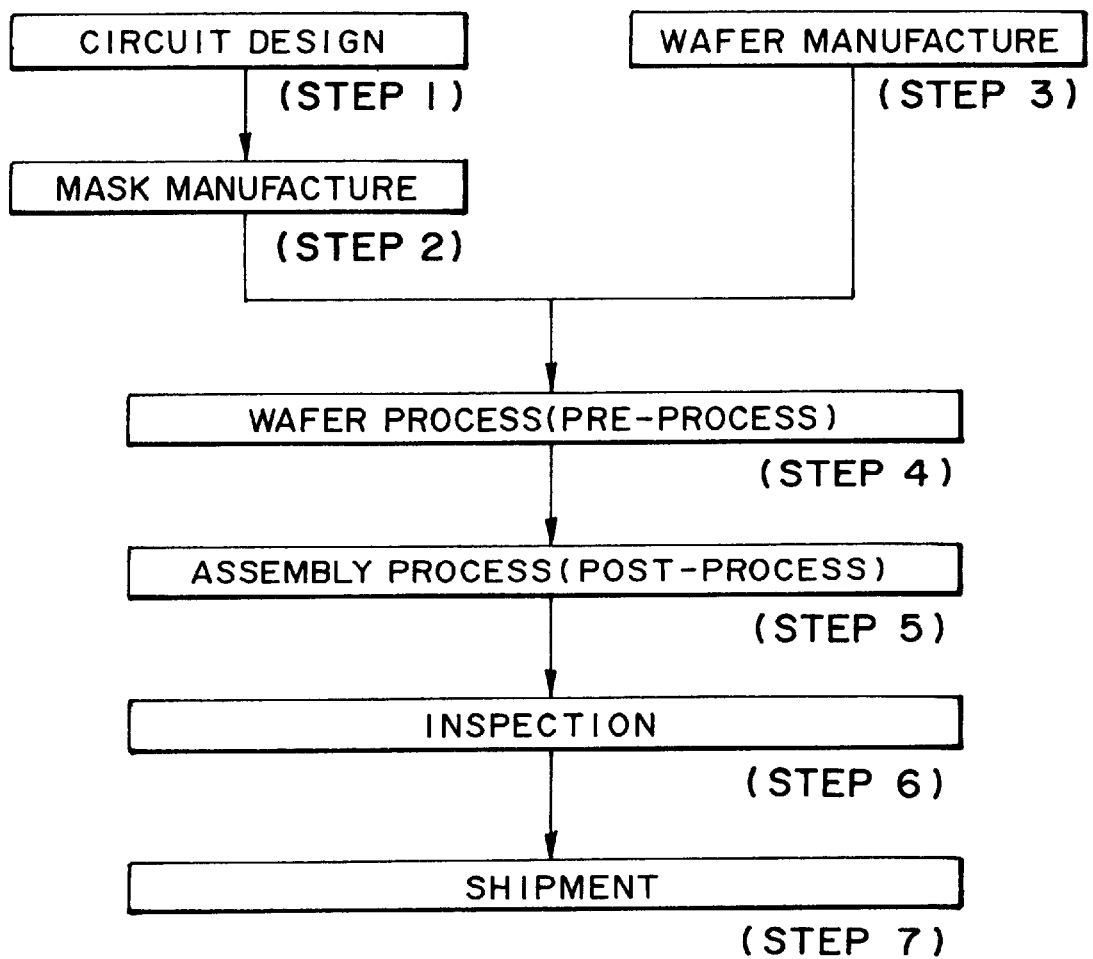
FIG. 10 is a flow chart for explaining semiconductor device manufacturing processes.

FIG. 10 is a flow chart of the sequence of manufacturing a semiconductor device such as a semiconductor chip (e.g., an IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 11:
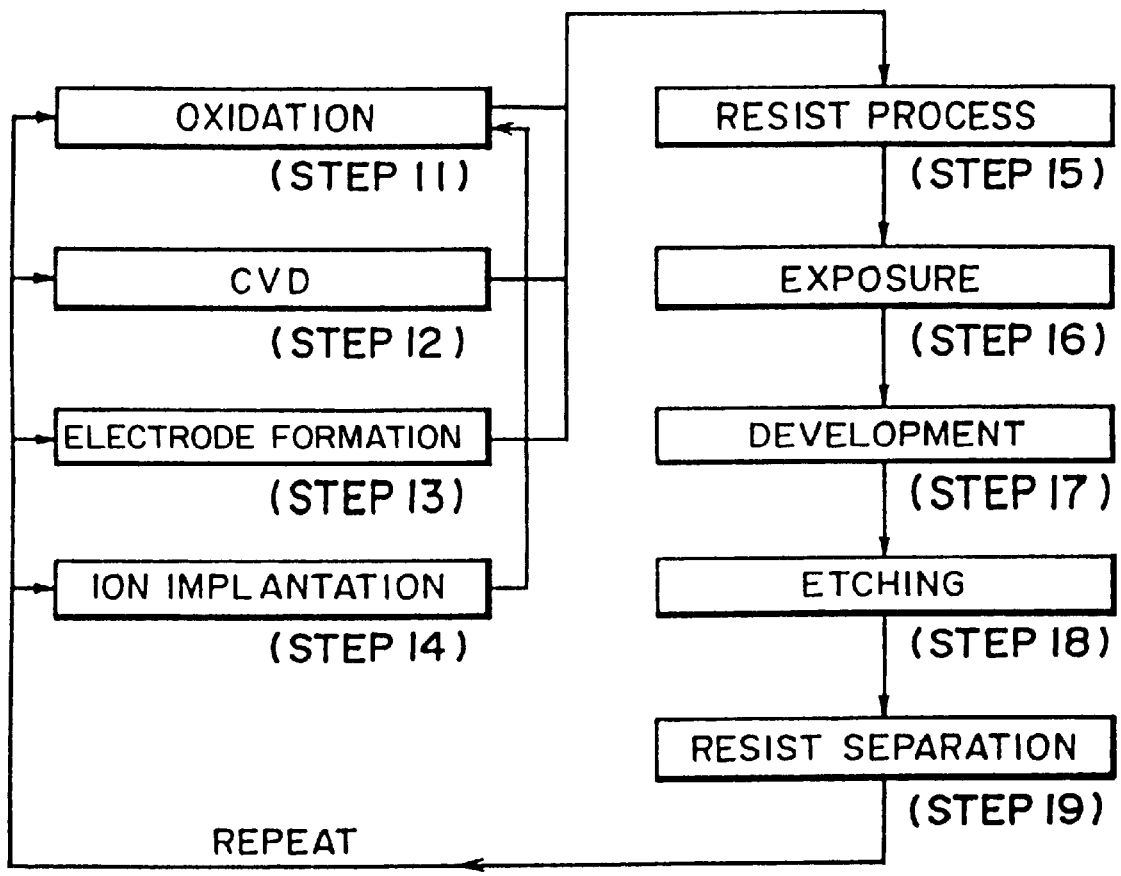
FIG. 11 is a flow chart for explaining details of a wafer process among the processes of FIG. 10.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

a light source for providing pulse light;

mask scanning means for scanning a mask having a pattern;

wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer;

light emission period determining means for determining an emission period of the pulse light when a required precision of an integrated exposure amount is changed, wherein the emission period is changed in accordance with the changed precision of the integrated exposure amount; and an interface into which information related to the required precision of the integrated exposure amount is inputted and from which the information is outputted to said light emission period determination means.

2. An apparatus according to claim 1, wherein the light emission period is larger with a lower precision required for the integrated exposure amount.

3. An apparatus according to claim 2, wherein the light emission period is highest within a range in which the integrated exposure amount is satisfied.

4. An apparatus according to claim 3, wherein the light emission period is determined on the basis of a scan speed of the mask and the wafer, and wherein the scan speed is maximized.

5. An apparatus according to claim 4, wherein the scan speed is limited by precision of alignment of the mask and the wafer.

6. An apparatus according to claim 1, wherein the integrated exposure amount is determined on the basis of a minimum linewidth of the pattern.

7. An apparatus according to claim 6, wherein a lower precision is required for the integrated exposure amount with a wider minimum linewidth of the pattern.

8. An exposure apparatus, comprising:

a light source for providing pulse light;

mask scanning means for scanning a mask having a pattern;

wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer;

illumination range limiting means for limiting a range of illumination for the mask by the plse light, said illumination range limiting means changing the range of illumination for the mask;

illumination range determining means for determining a range of illumination for the mask when a required precision of an integrated exposure amount is changed, wherein the range of illumination is changed in accordance with the changed precision of the integrated exposure amount; and an interface into which information related to the required precision of the integrated exposure amount is inputted and from which the information is outputted to said illumination range determining means.

9. An apparatus according to claim 8, wherein a width of the illumination range with respect to the scan direction is narrower with a lower precision required for the integrated exposure amount.

10. An apparatus according to claim 8, wherein the integrated exposure amount is determined on the basis of a minimum linewidth of the pattern.

11. An apparatus according to claim 10, wherein a lower precision is required for the integrated exposure amount with a wider minimum linewidth of the pattern.

12. An exposure apparatus, comprising:

a light source for providing pulse light;

mask scanning means for scanning a mask having a pattern;

wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer;

illumination range limiting means for limiting a range of illumination for the mask by the pulse light, said illumination range limiting means changing the range of illumination for the mask;

position changing means for changing a position of said illumination range limiting means with respect to a direction of an optical axis;

position determining means for determining the position of said illumination range limiting means when a required precision of an integrated exposure amount is changed, wherein the position of the illumination range limiting means is changed in accordance with the changed precision of the integrated exposure amount; and an interface into which information related to the required precision of the integrated exposure amount is inputted and from which the information is outputted to said illumination range determining means.

13. An apparatus according to claim 12, wherein the position of the illumination range limiting means with respect to the optical axis direction has a deviation from a position being optically conjugate with the mask, the deviation being smaller with a lower precision required for the integrated exposure amount.

14. An apparatus according to claim 12, wherein the integrated exposure amount is determined on the basis of a minimum linewidth of the pattern.

15. An apparatus according to claim 14, wherein a lower precision is required for the integrated exposure amount with a wider minimum linewidth of the pattern.

16. A device manufacturing method including lithographically transferring a pattern of a mask onto a wafer, said method comprising the steps of:
    providing pulse light;
    scanning the mask and the wafer in a timed relation;
    illuminating the mask while superposing portions of an illumination region defined by the pulse light and being narrower than the pattern such that the pattern is lithographically transferred onto the wafer;
    determining an emission period of the pulse light when a required precision of an integrated exposure amount is changed, prior to an actual exposure process, wherein the emission period is changed in accordance with the changed precision of the integrated exposure amount; and
    inputting information related to the required precision of the integrated exposure amount into an interface and outputting the information for determining the emission period of the pulse light from the interface.

17. An apparatus according to claim 16, wherein the light emission period is larger with a lower precision required for the integrated exposure amount.

18. A method according to claim 17, wherein the light emission period is highest within a range in which the integrated exposure amount is satisfied.

19. A method according to claim 18, wherein the light emission period is determined on the basis of a scan speed of the mask and the wafer, and wherein the scan speed is maximized.

20. A method according to claim 19, wherein the scan speed is limited by precision of alignment of the mask and the wafer.

21. A method according to claim 16, wherein the integrated exposure amount is determined on the basis of a minimum linewidth of the pattern.

22. A method according to claim 16, wherein a lower precision is required for the integrated exposure amount with a wider minimum linewidth of the pattern.

23. A device manufacturing method including lithographically transferring a pattern of a mask onto a wafer, said method comprising the steps of:
    providing pulse light;
    scanning the mask and the wafer in a timed relation;
    illuminating the mask while superposing portions of an illumination region defined by the pulse light and being narrower than the pattern such that the pattern is lithographically transferred onto the wafer;
    determining an illumination range for illumination of the mask by the pulse light when a required precision of an integrated exposure amount is changed, wherein the illumination range is changed in accordance with the changed precision of the integrated exposure amount; and
    inputting information related to the required precision of the integrated exposure amount into an interface and outputting the information for determining the illumination range for illumination of the mask by the pulse light from the interface.

24. A method according to claim 23, wherein a width of the illumination range with respect to the scan direction is narrower with a lower precision required for the integrated exposure amount.

25. A method according to claim 23, wherein the integrated exposure amount is determined on the basis of a minimum linewidth of the pattern.

26. A method according to claim 25, wherein a lower precision is required for the integrated exposure amount with a wider minimum linewidth of the pattern.

27. A device manufacturing method including lithographically transferring a pattern of a mask onto a wafer, said method comprising the steps of:
    providing pulse light;
    scanning the mask and the wafer in a timed relation;
    illuminating the mask while superposing portions of an illumination region defined by the pulse light and being narrower than the pattern such that the pattern is lithographically transferred onto the wafer;
    determining a position of illumination range limiting, for limiting a range of illumination of the mask by the pulse light, with respect to a direction of an optical axis when a required precision of an integrated exposure amount is changed, wherein the position of the illumination range limiting means is changed in accordance with the changed precision of the integrated exposure amount; and
    inputting information related to the required precision of the integrated exposure amount into an interface and outputting the information for determining the position of the illumination range limiting for limiting the range of illumination of the mask by the pulse light from the interface.

28. A method according to claim 27, wherein the position of the illumination range limiting means with respect to the optical axis direction has a deviation from a position being optically conjugate with the mask, the deviation being smaller with a lower precision required for the integrated exposure amount.

29. A method according to claim 27, wherein the integrated exposure amount is determined on the basis of a minimum linewidth of the pattern.

30. A method according to claim 29, wherein a lower precision is required for the integrated exposure amount with a wider minimum linewidth of the pattern.

31. An exposure apparatus comprising:
    a light source for providing pulse light;
    mask scanning means for scanning a mask having a pattern;
    wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer; and
    light emission period determining means for determining an emission period of the pulse light when a required precision of an integrated exposure amount is changed, wherein the emission period is changed in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

32. An exposure apparatus comprising:

a light source for providing pulse light;

mask scanning means for scanning a mask having a pattern;

wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer;

illumination range limiting means for limiting a range of illumination for the mask by the pulse light, said illumination range limiting means changing the range of illumination for the mask; and illumination range determining means for determining a range of illumination for the mask when a required precision of an integrated exposure amount is changed, wherein the range of illumination is changed in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

33. An exposure apparatus comprising:

a light source for providing pulse light;

mask scanning means for scanning a mask having a pattern;

wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer;

illumination range limiting means for limiting a range of illumination for the mask by the pulse light, said illumination range limiting means changing the range of illumination for the mask;

position changing means for changing a position of said illumination range limiting means with respect to a direction of an optical axis; and position determining means for determining the position of said illumination range limiting means when a required precision of an integrated exposure amount is changed, wherein the position of the illumination range limiting means is changed in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

34. A device manufacturing method including lithographically transferring a pattern of a mask onto a wafer, said method comprising the steps of:

providing pulse light;

scanning the mask and the wafer in a timed relation;

illuminating the mask while superposing portions of an illumination region defined by the pulse light and being narrower than the pattern such that the pattern is lithographically transferred onto the wafer; and determining an emission period of the pulse light when a reguired precision of an integrated exposure amount is changed, prior to an actual exposure process, wherein the emission period is changed in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

35. A device manufacturing method including lithographically transferring a pattern of a mask onto a wafer, said method comprising the steps of:

providing pulse light;

scanning the mask and the wafer in a timed relation;

illuminating the mask while superposing portions of an illumination region defined by the pulse light and being narrower than the pattern such that the pattern is lithographically transferred onto the wafer; and determining an illumination range for illumination of the mask by the pulse light when a required precision of an integrated exposure amount is changed, wherein the illumination range is changed in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

36. A device manufacturing method including lithographically transferring a pattern of a mask onto a wafer, said method comprising the steps of:

providing pulse light;

scanning the mask and the wafer in a timed relation;

illuminating the mask while superposing portions of an illumination region defined by the pulse light and being narrower than the pattern such that the pattern is lithographically transferred onto the wafer; and determining a position of illumination range limiting means, for limiting a range of illumination of the mask by the pulse light, with respect to a direction of an optical axis when a required precision of an integrated exposure amount is changed, wherein the position of the illumination range limiting means is changed in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

37. An exposure apparatus, comprising:

a light source for providing pulse light;

mask scanning means for scanning a mask having a pattern;

wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer;

scan speed determining means for determining a scan speed of the mask and the wafer when a required precision of an integrated exposure amount is changed, wherein the scan speed is determined in accordance with the changed precision of the integrated exposure amount; and an interface into which information related to the required precision of the integrated exposure amount is inputted and from which the information is outputted to said scan speed determining means.

38. A device manufacturing method including lithographically transferring a pattern of a mask onto a wafer, said method comprising the steps of:

providing pulse light;

scanning the mask and the wafer in a timed relation;

illuminating the mask while superposing portions of an illumination region defined by the pulse light and being narrower than the pattern such that the pattern is lithographically transferred onto the wafer;

determining a scan speed of the mask and the wafer when a required precision of an integrated exposure amount is changed, wherein the scan speed is determined in accordance with the changed precision of the integrated exposure amount; and inputting information related to the required precision of the integrated exposure amount into an interface and outputting the information for determining the scan speed of the mask and the wafer from the interface.

39. An exposure apparatus, comprising:

a light source for providing pulse light;

mask scanning means for scanning a mask having a pattern;

wafer scanning means for scanning a wafer onto which the pattern is to be projected, wherein said mask scanning means and said wafer scanning means scan the mask and the wafer in a timed relation so that the mask is illuminated while superposing portions of an illumination region defined by the pulse light and being narrower than the pattern such that the pattern is lithographically transferred onto the wafer; and scan speed determining means for determining a scan speed of the mask and the wafer when a required precision of an integrated exposure amount is changed, wherein the scan speed is determined in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

40. A device manufacturing method including lithographically transferring a pattern of a mask onto a wafer, said method comprising the steps of:

providing pulse light;

scanning the mask and the wafer in a timed relation;

illuminating the mask while superposing portions of an illumination region defined by the pulse light and being narrower than the pattern such that the pattern is lithographically transferred onto the wafer; and determining a scan speed of the mask and the wafer when a required precision of an integrated exposure amount is changed, wherein the scan speed is determined in accordance with the changed precision of the integrated exposure amount, wherein the required precision of the integrated exposure amount is designated as a tolerance ratio ΔS/S for an integrated exposure amount non-uniformness, the tolerance ratio corresponding to a ratio of a tolerance value ΔS for non-uniformness of the integrated exposure amount to a target value S of the integrated exposure amount.

* * * * *

UNITED STATES PATENT AND TRADEMARK OFFICE
CERTIFICATE OF CORRECTION

PATENT NO. : 6,204,911 B1
DATED : March 20, 2001
INVENTOR(S) : Hiroshi Kurosawa et al.

It is certified that error appears in the above-identified patent and that said Letters Patent is hereby corrected as shown below:

Sheet 5,
Figure 7, "DERECTION" should read -- DIRECTION --.

Column 2,
Line 21, "projected;" should read -- projected, --.
Line 42, "lin-" should read -- line --.
Line 43, "ewidth" should read -- width --.

Column 3,
Line 4, "in" should read -- in an --.
Line 5, "sli" should read -- slit --.

Column 6,
Line 54, "of" should read -- of the --.

Column 9,
Line 36, "Wo" should read -- $W_o$ --.

Column 10,
Line 42, "S=($_o$·d)/(v·T)" should read -- S=($i_o$·d)/(v·T) --.

Column 11,
Line 6, "hand" should read -- hand, --.

UNITED STATES PATENT AND TRADEMARK OFFICE
CERTIFICATE OF CORRECTION

PATENT NO. : 6,204,911 B1
DATED : March 20, 2001
INVENTOR(S) : Hiroshi Kurosawa et al.

It is certified that error appears in the above-identified patent and that said Letters Patent is hereby corrected as shown below:

Column 14,
Line 14, "plse" should read -- pulse --.
Line 67, "illumination range" should read -- position Column 18,
Line 14, "reguired" should read -- required --.

Signed and Sealed this

Twenty-sixth Day of February, 2002

Attest:

JAMES E. ROGAN
*Attesting Officer*     *Director of the United States Patent and Trademark Office*